US012353068B2

(12) United States Patent
Neel et al.

(10) Patent No.: US 12,353,068 B2
(45) Date of Patent: Jul. 8, 2025

(54) METHOD FOR ON-SILICON INTEGRATION OF A COMPONENT III-V AND ON-SILICON INTEGRATED COMPONENT III-V

(71) Applicants: COMMISSARIAT A L'ENERGIE ATOMIQUE ET AUX ENERGIES ALTERNATIVES, Paris (FR); THALES, Courbevoie (FR)

(72) Inventors: Delphine Neel, Palaiseau (FR); David Bitauld, Palaiseau (FR)

(73) Assignees: COMMISSARIAT A L'ENERGIE ATOMIQUE ET AUX ENERGIES ALTERNATIVES, Paris (FR); THALES, Courbevoie (FR)

( * ) Notice: Subject to any disclaimer, the term of this patent is extended or adjusted under 35 U.S.C. 154(b) by 345 days.

(21) Appl. No.: 18/053,959

(22) Filed: Nov. 9, 2022

(65) Prior Publication Data

US 2023/0145652 A1 May 11, 2023

(30) Foreign Application Priority Data

Nov. 9, 2021 (FR) ...................................... 21 11895

(51) Int. Cl.
*G02F 1/017* (2006.01)
*C23C 16/02* (2006.01)
(Continued)

(52) U.S. Cl.
CPC ...... *G02F 1/01708* (2013.01); *C23C 16/0227* (2013.01); *C23C 16/18* (2013.01);
(Continued)

(58) Field of Classification Search
CPC ............. G02F 1/01708; G02F 2202/06; G02F 2202/101; G02F 2202/102;
(Continued)

(56) References Cited

U.S. PATENT DOCUMENTS 9,941,664 B1 4/2018 Hahn et al.
2015/0241648 A1* 8/2015 Kikuchi ................ H10F 77/147
438/69

(Continued)

FOREIGN PATENT DOCUMENTS

EP 2 866 313 A1 4/2015
EP 3 642 914 A1 4/2020

OTHER PUBLICATIONS

French Preliminary Search Report and Written Opinion Issued Aug. 4, 2022 in French Application 21 11895 filed on Nov. 9, 2021 (with English Translation of Categories of Cited Documents), 12 pages.
Ramirez, J. et al., "III-V-on-Silicon Integration: From Hybrid Devices to Heterogeneous Photonic Integrated Circuits", IEEE Journal of Selected Topics in Quantum Electronics, vol. 26, No. 2, 2020, Abstract Only, 1 page.
Lourdudoss et al., "Future Directions in Silicon Photonics", Chennupati (ed.). Elsevier, Academic Press, 2019, 4 pages.

(Continued)

*Primary Examiner* — Jerry M Blevins
(74) *Attorney, Agent, or Firm* — Oblon, McClelland, Maier & Neustadt, L.L.P.

(57) ABSTRACT

A method for on-silicon integration of a III-V-based material component includes providing a first substrate having a silicon-based optical layer including a waveguide, transferring a second substrate of III-V-based material on the optical layer, and forming the III-V component from the second substrate, so as to enable a coupling between the waveguide and the III-V component, by preserving a III-V-based material layer extending laterally. The method also includes forming by epitaxy from the III-V layer, an InP:Fe-based structure laterally bordering the III-V component, forming a layer including contacts configured to contact the III-V component, and transferring a third silicon-based substrate onto the layer including the contacts.

12 Claims, 7 Drawing Sheets

(51) Int. Cl.
*C23C 16/18* (2006.01)
*C30B 25/18* (2006.01)
*C30B 29/40* (2006.01)
*C30B 31/22* (2006.01)
*C30B 33/10* (2006.01)
*H10F 71/00* (2025.01)

(52) U.S. Cl.
CPC .............. *C30B 25/18* (2013.01); *C30B 29/40* (2013.01); *C30B 31/22* (2013.01); *C30B 33/10* (2013.01); *H10F 71/127* (2025.01); *H10F 71/128* (2025.01); *H10F 71/139* (2025.01); *G02F 2202/06* (2013.01); *G02F 2202/101* (2013.01); *G02F 2202/102* (2013.01); *G02F 2202/108* (2013.01); *G02F 2203/50* (2013.01)

(58) Field of Classification Search
CPC ........... G02F 2202/108; G02F 2203/50; H10F 71/128; H10F 71/127; H10F 71/139; C23C 16/0227; C23C 16/18; C30B 25/18; C30B 29/40; C30B 31/22; C30B 33/10
USPC ............................................................. 385/3
See application file for complete search history.

(56) References Cited

U.S. PATENT DOCUMENTS

| | | |
|---|---|---|
| 2017/0047312 A1 | 2/2017 | Budd et al. |
| 2017/0186670 A1 | 6/2017 | Budd et al. |
| 2017/0186739 A1 | 6/2017 | Budd et al. |
| 2018/0040597 A1 | 2/2018 | Budd et al. |
| 2018/0114785 A1 | 4/2018 | Budd et al. |
| 2019/0074664 A1 | 3/2019 | Ito et al. |
| 2021/0143609 A1 | 5/2021 | Hiratani |
| 2021/0151950 A1 | 5/2021 | Menezo et al. |
| 2021/0356663 A1* | 11/2021 | Yu ....................... G02B 6/12002 |
| 2022/0013988 A1* | 1/2022 | Yang .................... H01S 5/0421 |
| 2023/0107343 A1* | 4/2023 | Yang ................. H10H 20/8215 |
| | | 438/460 |

OTHER PUBLICATIONS

Besancon, C. et al., "Epitaxial Growth of High-Quality AlGaInAs-Based Active Structures on a Directly Bonded InP- $SiO_2$/Si Substrate", Physica Status Solidi (a), vol. 217, No. 3, 2020, Abstract Only, 1 page.

Zhang, C. et al., "Thermal Management of Hybrid Silicon Ring Lasers for High Temperature Operation", IEEE Journal of Selected Topics in Quantum Electronics, vol. 21, No. 6, 2015, 7 pages.

* cited by examiner

METHOD FOR ON-SILICON INTEGRATION OF A COMPONENT III-V AND ON-SILICON INTEGRATED COMPONENT III-V

TECHNICAL FIELD

The field of the invention is that of on-chip integrated photonics. The invention relates more specifically to producing material III-V-based components, for example lasers or phase modulators, on a silicon-based microelectronic chip.

STATE OF THE ART

In the field of photonics, one of the more promising development paths relates to the hetero-integration of material III-V-based components on a silicon-based microelectronic chip. This technological hybridisation makes it possible to benefit from both optoelectronic performances of components III-V, and from the advantages and performances of silicon components.

Such a hybridisation is done typically by transfer of a substrate or a material III-V-based component on a substrate or a silicon-based component. After gluing, other method steps make it possible to operate the assembly, for example in order to obtain a laser III-V controlled by CMOS (Complementary Metal Oxide Semiconductor, in reference to the technology based on N- and P-based complementary MOS transistors) control electronics coming from silicon technology.

One of the challenges linked to this hybridisation is based on the dissipation of heat produced during the operation of the components III-V. The stack of different levels having different functions, typically a silicon-based optical guiding level, an interconnection level, a CMOS level, makes the management of the heat dissipation complex. The different elements integrated around the components III-V must be considered in the design of a thermally efficient architecture.

For example, a thick BOX (Buried Oxide) layer forms a thermal insulation barrier and prevents a good heat dissipation. Furthermore, it must be avoided that the heat dissipation is done through CMOS components, the performances of which are degraded when they are excessively heated.

Document EP3642914A1 discloses an architecture when the laser III-V is disposed as close as possible to a silicon-based heat dissipation layer coming from a silicon substrate. In a known manner, this architecture thus successively comprises, in a stack: the silicon-based heat dissipation layer, the laser III-V, a silicon waveguide, an interconnection layer, control electronics.

The proximity of the laser with the heat dissipation layer improves the cooling of the laser. The arrangement of the control electronics opposite the heat dissipation layer avoids the control electronics being impacted by the dissipated heat of the laser. This solution is however not optimal. The heat dissipation flows remain limited. The optical power of such a component still remains limited.

There is therefore a need consisting of improving the heat dissipation of an on-silicon hybridised component III-V. An aim of the present invention is to respond to this need.

An aim of the present invention relates to an on-silicon component III-V having an improved heat dissipation.

Another aim of the present invention relates to a method for manufacturing such an on-silicon component III-V.

Other aims, features and advantages of the present invention will appear upon examining the following description and the accompanying drawings.

SUMMARY

To achieve this aim, according to an embodiment, an on-silicon integration of a material III-V-based component is provided, called component III-V, comprising at least the following steps:
  Providing a first substrate comprising a silicon-based optical layer, said optical layer comprising at least one waveguide,
  Transferring a second material III-V-based substrate on the optical layer,
  Forming the component III-V from said second substrate in the proximity of the waveguide so as to enable a coupling between the waveguide and said component III-V, and by preserving a material III-V-based layer extending laterally from the component III-V,
  Forming, by epitaxy, from said material III-V-based layer, an InP:Fe-based structure laterally bordering the component III-V,
  Forming a layer comprising contacts, called contacts III-V and intended to electrically contact the component III-V, on a face of the component III-V opposite the optical layer,
  Transferring a third silicon-based substrate onto said layer comprising the contacts III-V,
  Removing preferably the first substrate, by preserving the optical layer,
  Forming preferably at least one interconnection layer on the optical layer, said interconnection layer comprising interconnections electrically connecting the contacts III-V.

Thus, the third silicon-based substrate forms a heat dissipation layer, and the optical layer comprising the waveguide, and the interconnection level are disposed opposite this heat dissipation layer, visà-vis the component III-V. Advantageously, the InP:Fe-based structure bordering the component III-V forms a heat dissipation structure around the component III-V, and facing the heat dissipation layer formed by the third substrate. This considerably improves the heat dissipation flows between the component III-V and the heat dissipation layer.

Contrary to the silicon oxide used as insulation material around the component III-V in the architecture disclosed by document EP3642914B1, the InP:Fe-based heat dissipation structure is, in this case, specifically chosen to provide a good electrical insulation and a good thermal conduction. Such a structure is also called semi-insulating structure or SIBH (semi-insulating buried heterostructure) below.

According to an advantageous embodiment, the removal of the first substrate is done so as to expose the optical layer and/or the waveguide. An implantation is thus carried out, after removal of the first substrate, in a silicon-based zone of the optical layer. This makes it possible to form doped silicon zones after having achieved the SIBH structure. A PN junction phase modulator can thus be formed, after formation of the SIBH structure and before formation of the interconnection level.

Such a SIBH structure is typically formed by epitaxy at temperatures greater than or equal to 600° C. Such temperatures are generally incompatible with certain method steps specific to silicon-based components, typically for components requiring a localised doping of the silicon by implantation. At such temperatures, the dopants diffuse outside of the doped silicon zones. The formation of SIBH is therefore incompatible with a prior doping. The formation of a PN junction, for example of a phase modulator, in the optical layer comprising the waveguide, such as disclosed by document EP3642914A1 is therefore incompatible with the implementation of the method presented in this case.

The architecture thus obtained by the implementation of the method therefore has an improved heat dissipation with respect to the architecture known from document EP3642914A1, while making it possible to integrate doped silicon-based components.

According to another aspect, an integration system having such an architecture of component III-V integrated on a silicon substrate is proposed.

According to an embodiment, the integration system comprises, in a stack in a direction z:
- A silicon-based substrate,
- A layer comprising contacts, called contacts III-V, intended to electrically contact a material III-V-based component, called component III-V,
- The component III-V laterally bordered by an InP:Fe-based structure,
- A material III-V-based layer covering the component III-V and the InP:Fe-based structure,
- A silicon-based optical layer comprising a waveguide coupled to the component III-V,
- Preferably, an interconnection level comprising a first interconnection part electrically connecting the contacts III-V, and a second interconnection part intended to connect silicon-based components disposed on said interconnection level.

This integration system also has the advantages indicated above, linked to heat dissipation, and the possibility of easily connecting or integrating silicon-based components, such as control electronics. The heat produced by the component III-V in operation is advantageously dissipated through the InP:Fe-based structure and through the silicon-based substrate. The interconnection level located opposite the silicon-based substrate, visà-vis the component III-V, makes it possible to integrate connections with different components, typically silicon-based, by being protected from the heat coming from the component III-V.

According to a possibility, the optical layer of this integration system comprises other silicon-based components, for example a PN junction phase modulator connected via the interconnection level.

Other aims, features and advantages will appear upon examining the following description and the accompanying drawings. It is understood that other advantages can be incorporated. In particular, certain features and certain advantages of the integration method can be applied mutatis mutandis to the integration system, and reciprocally.

BRIEF DESCRIPTION OF THE FIGURES

The aims, objectives, as well as the features and advantages of the invention will best emerge from the detailed description of embodiments of the latter, which are illustrated by the following accompanying drawings, wherein.

Figure 1A:
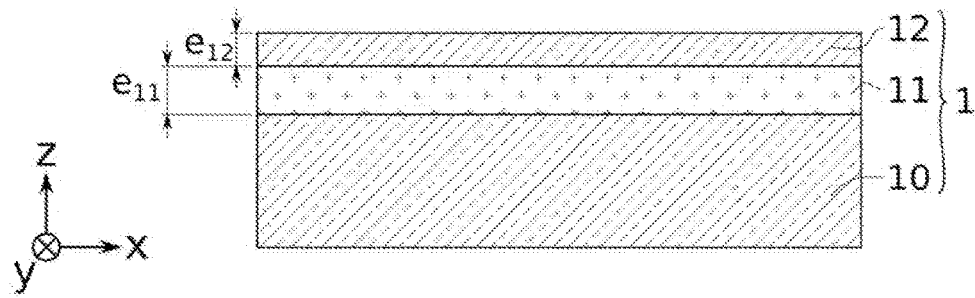
FIGS. 1A to 1N schematically illustrate, as a transverse cross-section, steps of an embodiment of an integration system according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the dimensions of the different elements (components, interconnections, layers and levels, control electronics, etc.) are not representative of reality.

DETAILED DESCRIPTION

Before starting a detailed review of embodiments of the invention, optional features are stated below, which can optionally be used in association or alternatively:

According to an example, the method further comprises, after transfer of the third silicon-based substrate, the following steps:
- Removing the first substrate by preserving the optical layer,
- Forming at least one interconnection level on the optical layer, said interconnection level comprising interconnections electrically connecting the contacts III-V.

According to an example, the removal of the first substrate is done so as to expose the optical layer, the method further comprising, after removal of the first substrate, a doping of a silicon-based zone of the optical layer. The doping can typically be done by implantation of doping species, followed by a thermal activation annealing.

According to an example, the method further comprises, before implantation of doping species, at least one other step carried out at a temperature greater than or equal to 600° C.

According to an example, the first substrate is an on-insulator semi-conductor type substrate, comprising a buried oxide layer between a first silicon bulk part and a second semi-conductor-based thin part. The semi-conductor can be typically taken from among the semi-conductors IV-IV, in particular silicon, germanium, silicon-germanium.

According to an example, the removal of the first substrate is configured to remove the first silicon bulk part and the buried oxide layer.

According to an example, the formation of the component III-V comprises:
- A thinning of the second material III-V-based substrate so as to preserve a material III-V-based germination layer,
- A formation of the component III-V by localised epitaxy only on a part of the germination layer.

According to an example, the formation of the component III-V comprises:
- A thinning of the second material III-V-based substrate so as to preserve a material III-V-based germination layer,
- A formation by epitaxy of a stack of material III-V-based functional layers, on the germination layer,
- An etching of a part of the stack so as to form the component III-V and the material III-V-based layer extending laterally from the component III-V.

According to an example, the second material III-V-based substrate comprises a sacrificial layer inserted between a so-called bulk part of the second substrate and a part intended to form the germination layer.

According to an example, the thinning comprises:
- At least one from among a mechanical cropping of the bulk part of the second substrate and/or a selective chemical etching of the bulk part of the second substrate visà-vis the sacrificial layer,
- A selective etching of the sacrificial layer visà-vis the layer intended to form the germination layer.

According to an example, the selective chemical etching of the bulk part of the second substrate vis-à-vis the sacrificial layer is carried out by wet etching on the basis of a hydrochloric (HCl) acid and phosphoric (H3PO4) acid mixture, for example in proportions HCl:H3PO4 of 1:10.

According to an example, the formation of the component III-V comprises a formation of quantum wells on the basis of an AlInGaAs or InGaAsP alloy.

According to an example, the method further comprises, before transfer of the third substrate, a formation of a thermal conduction layer on at least one from among the layer comprising the contacts III-V and the third substrate, so as to insert said thermal conduction layer between the third substrate and the layer comprising the contacts III-V.

According to an example, the material III-V-based layer extending laterally from the component III-V is N-doped InP-based.

According to an example, the integration system further comprises, on the silicon-based optical layer, an interconnection level comprising a first interconnection part electrically connecting the contacts III-V, and a second interconnection part intended to connect silicon-based components disposed on said interconnection level.

According to an example, the optical layer further comprises at least one other silicon-based component, for example a PN junction phase modulator, connected to the interconnection level.

According to an example, the material III-V-based layer covering the component III-V is N-doped InP-based.

According to an example, the component III-V comprises a P-doped InP-based part, and quantum wells on the basis of an AlInGaAs or GaInAsP alloy inserted between the P-doped InP-based part and the N-doped InP-based layer.

Except for being incompatible, technical features described in detail for a given embodiment can be combined with the technical features described in the context of other embodiments described as an example and in a non-limiting manner, so as to form another embodiment which is not necessarily illustrated or described. Such an embodiment is not obviously excluded from the invention.

In the scope of the present invention, a heat dissipation structure is implemented. This structure can also ensure an electrical insulation function. It can thus be called a "semi-insulating" structure, in the direction where this structure has a low electrical conductivity, but a high thermal conductivity. Typically, the electrical resistivity of such a structure is greater than $10^7$ Ω·cm, for example of around $10^8$ Ω·cm for an InP:Fe-based structure. Typically, the thermal conductivity of such a structure is greater than 0.5 W·cm$^{-1}$·K$^{-1}$, for example of around 0.68 W·cm$^{-1}$·K$^{-1}$ for an InP:Fe-based structure.

It is specified that, in the scope of the present invention, the terms "on", "surmounts", "covers", "underlying", "visàvis" and their equivalents do not necessarily mean "in contact with". Thus, for example, the deposition of a first layer on a second layer, does not necessarily mean that the two layers are directly in contact with one another, but means that the first layer covers at least partially the second layer by being either directly in contact with it, or by being separated from it by at least one other layer or at least one other element.

A layer can moreover be composed of several sublayers made of one same material or of different materials.

By a material A-"based" substrate, element, layer, this means a substrate, an element, a layer comprising this material A only or this material A and optionally other materials, for example, of alloy elements and/or doping elements. Thus, a "silicon-based" substrate can comprise a silicon bulk part, and a thin silicon or germanium, or SiGe alloy layer. A "silicon-based" optical layer can comprise a first silicon element, and/or a second germanium element, and/or a third SiGe element. An "InP-based" layer can comprise InP, InP:Fe comprising N- or P-doped Fe, InP impurities.

By "selective etching vis-à-vis" or "etching having a selectivity visà-vis", this means an etching configured to remove a material A or a layer A visà-vis a material B or a layer B, and having an etching speed of the material A greater than the etching speed of the material B. The selectivity is the ratio between the etching speed of the material A over the etching speed of the material B.

A preferably orthonormal marker, comprising the axes x, y, z is represented in the accompanying figures. When one single marker is represented on one same set of figures, this marker is applied to all the figures of this set.

The relative terms such as "on", "surmounts", "under", "underlying" refer to positions taken in the direction z. This list of terms is not exhaustive. Other relative terms can be easily specified if needed, by referring to the accompanying drawings.

In the present patent application, the height and the depth are taken along z.

The terms "vertical", "vertically" refer to a direction along z. The terms "horizontal", "horizontally" refer to a direction in the plane xy. The terms "lateral", "laterally", when this relates to a movement, an extension or a positioning, refer also to a direction in the plane xy, typically the direction x.

An element located "in vertical alignment with" or "to the right of" another element means that these two elements are both located on one same line oriented vertically in the figures. This does not necessarily mean that these two elements are centred with respect to a vertical axis.

By material III-V, this means an alloy comprising elements of the columns IIIB and VB of the periodic table of elements (block p).

In a non-limiting manner, the materials III-V implemented in the method and the integration system comprise: InP, AlN, InGaAs, AlInGaAs.

Figure 1B:
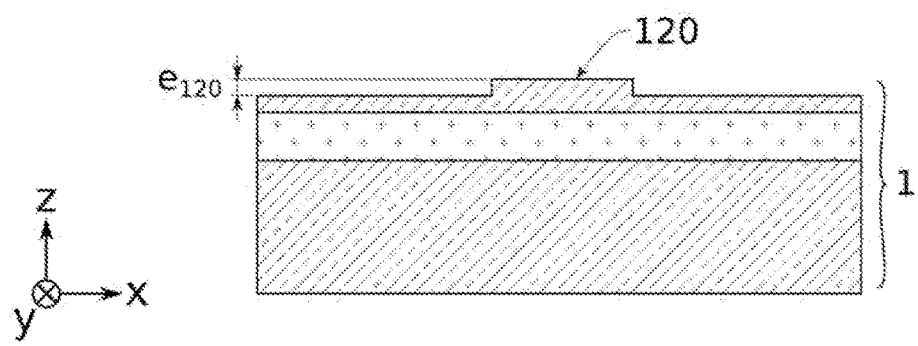
Figure 1C:
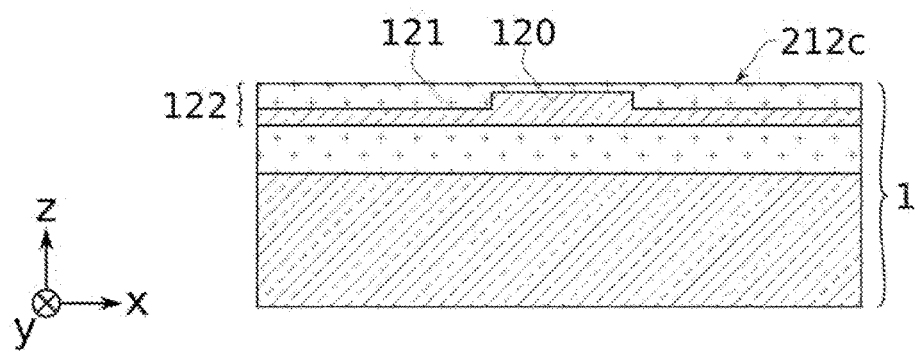
Figure 1D:
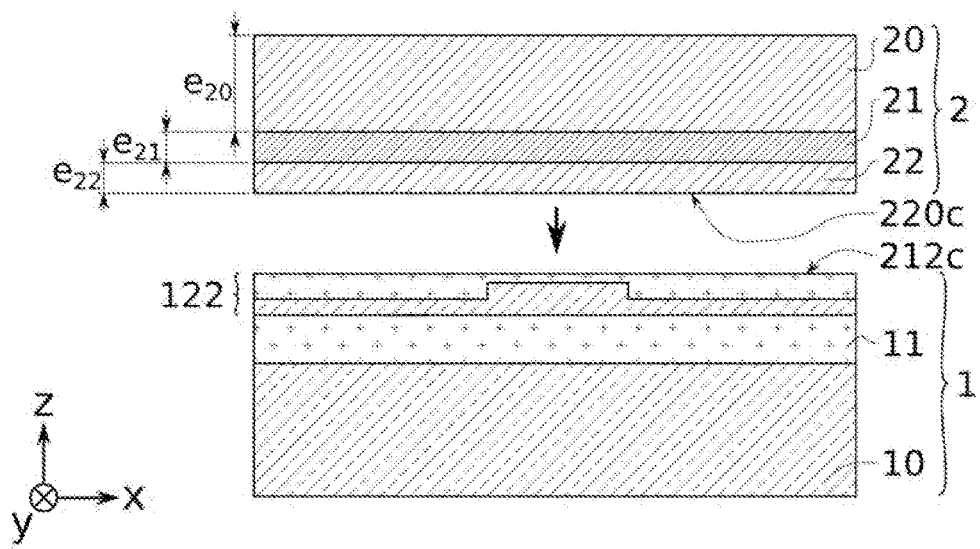
Figure 1E:
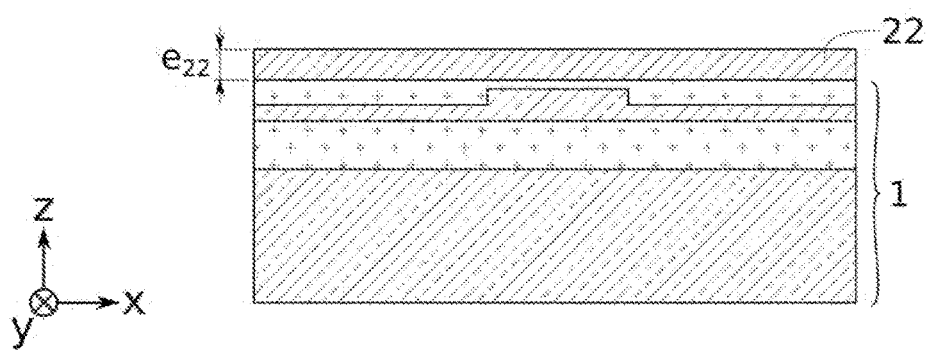
Figure 1F:
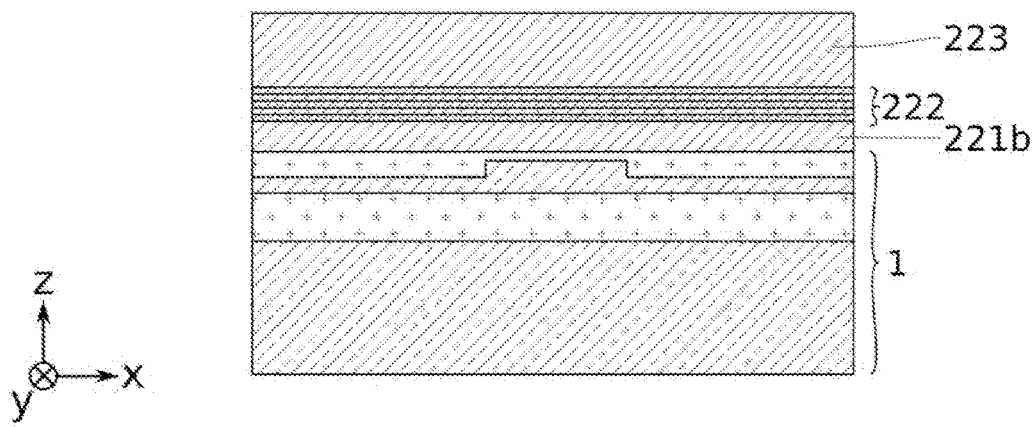
Figure 1G:
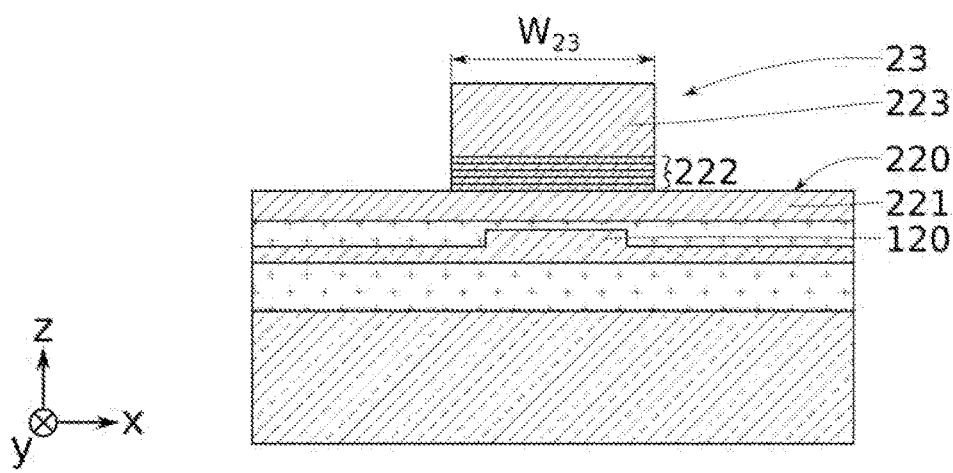
Figure 1H:
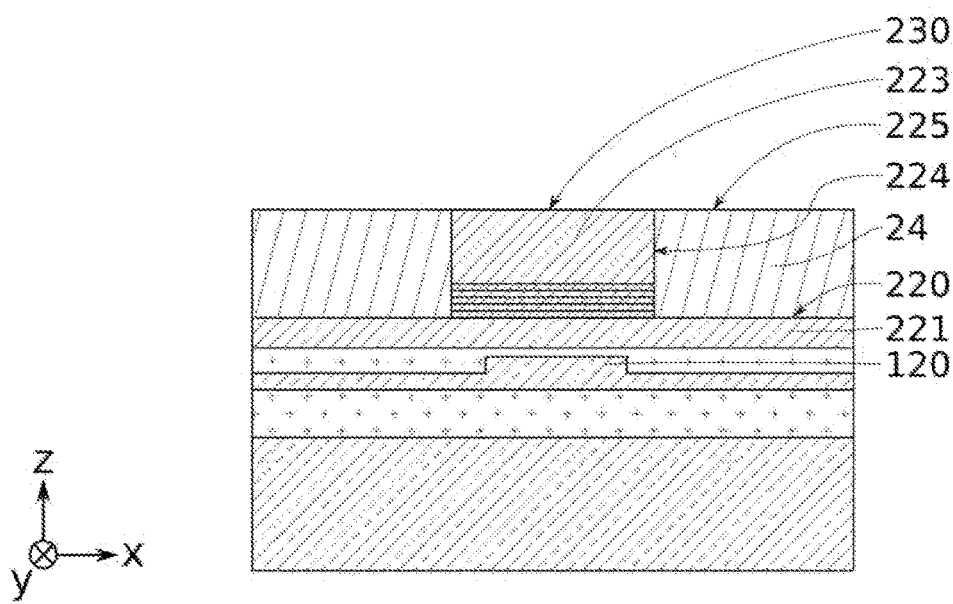
Figure 1I:
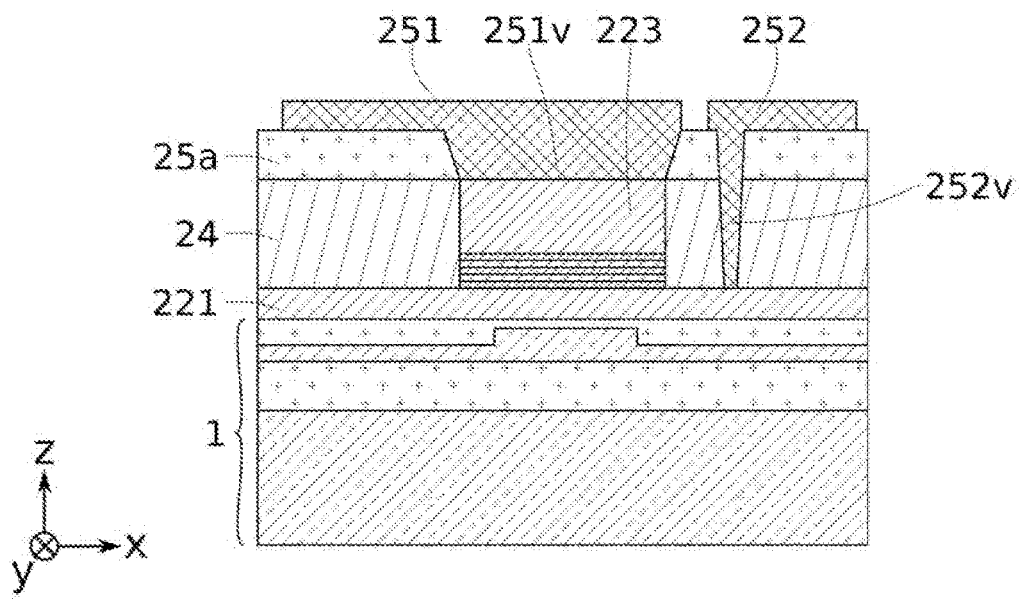
Figure 1J:
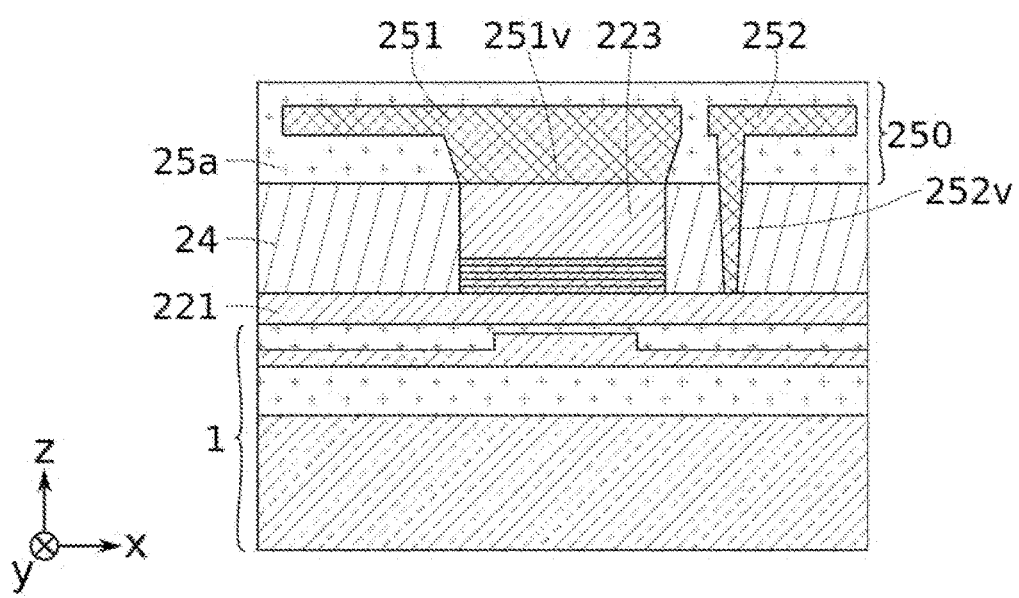
Figure 1K:
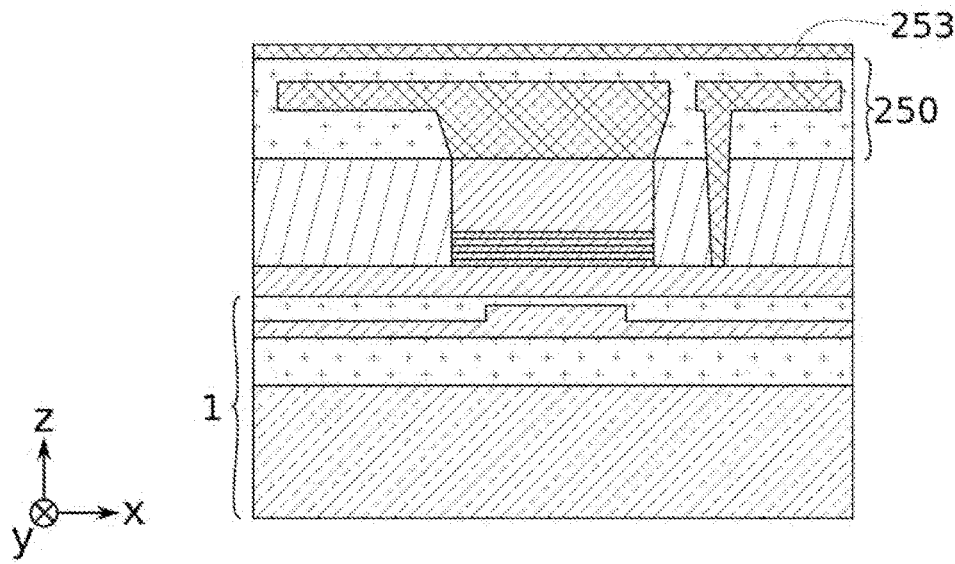
Figure 1L:
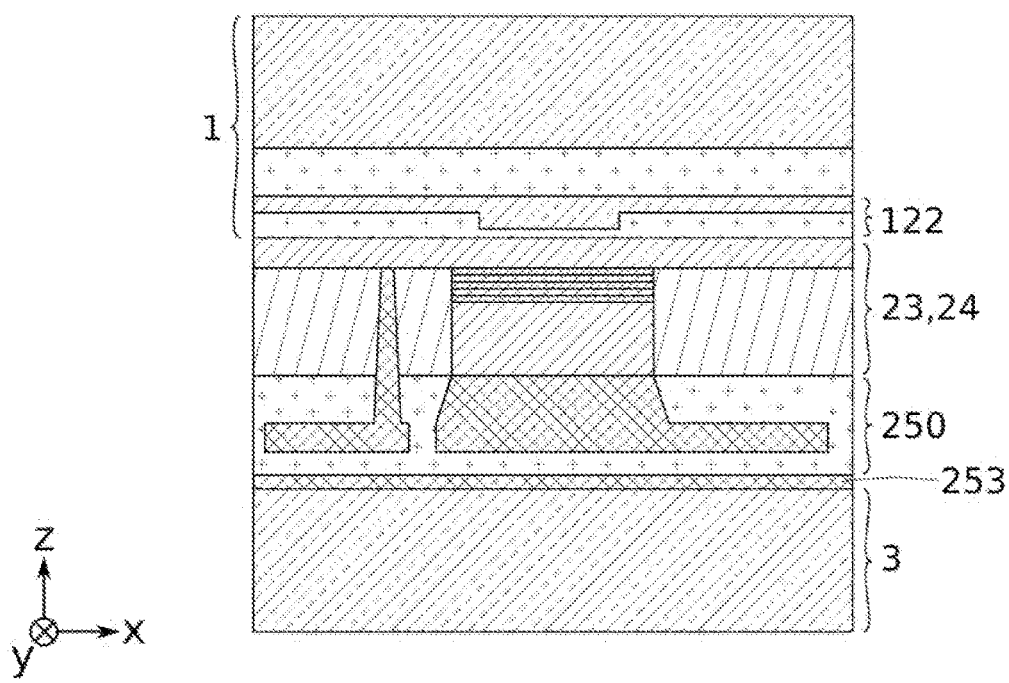
Figure 1M:
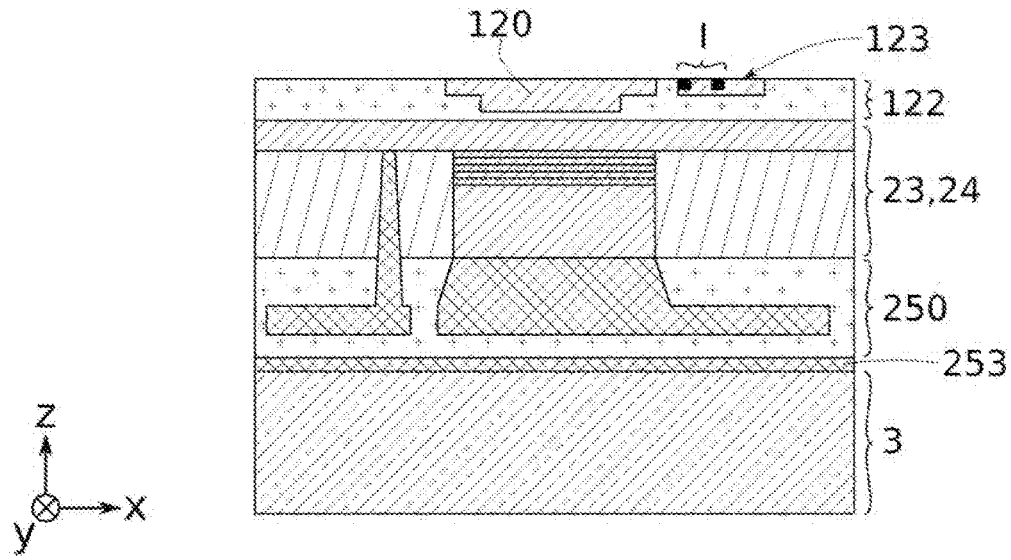
Figure 1N:
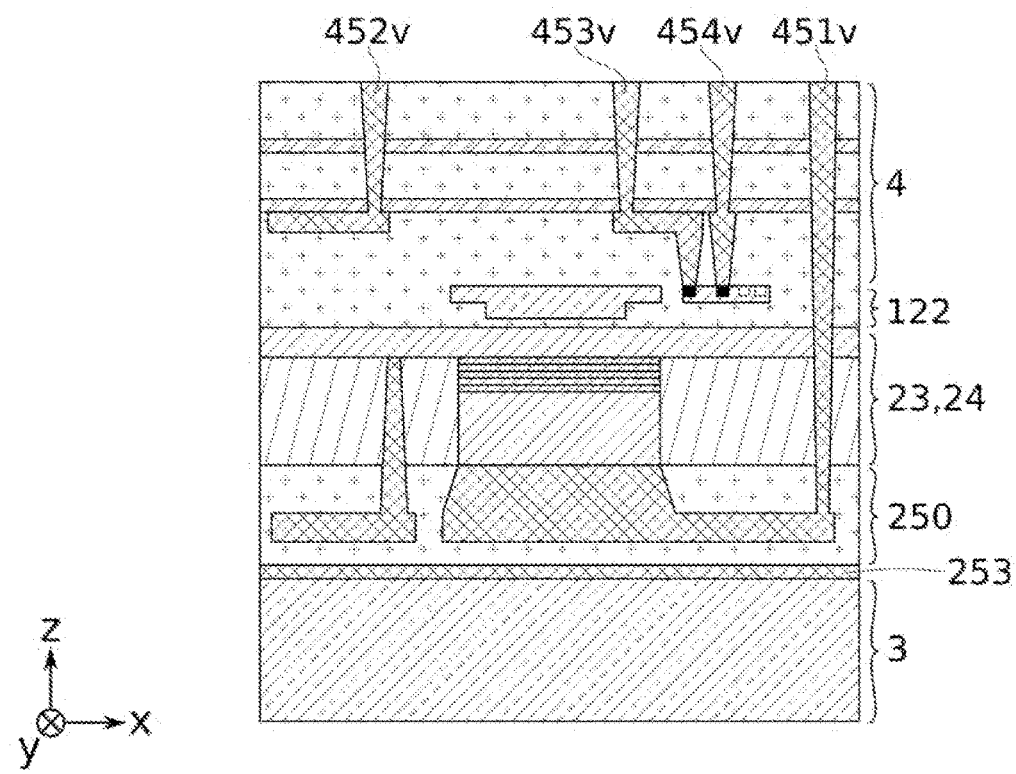

FIGS. 1A to 1N illustrate an embodiment of an architecture enable the hetero-integration of a component III-V coupled to a silicon waveguide, with an improved heat dissipation.

As illustrated in FIG. 1A, a first substrate 1 of SOI (Silicon On Insulator) type is typically provided. This substrate 1 typically comprises in a stack along z, a so-called bulk silicon part 10, a so-called BOX buried oxide layer 11, and a superficial layer 12, also called top Si.

The thickness $e_{11}$ of the BOX 11 is typically around 1 μm to 2 μm. The thickness $e_{12}$ of the top Si 12 is typically around 300 nm to 600 nm, for example around 500 nm. This thickness $e_{12}$ of 500 nm can be obtained by silicon regrowth from a thin silicon layer of an SOI substrate having a standard thickness of top Si of 100 nm or 200 nm.

As illustrated in FIG. 1B, the top Si layer 12 is etched over a depth $e_{120}$ typically of between 200 nm and 300 nm, so as to form a waveguide structure 120 at the edge.

As illustrated in FIG. 1C, the structure obtained is then covered by a silicon oxide-based encapsulation layer 121, before being planarised in a known manner by chemical-mechanical polishing (CMP). This makes it possible to obtain a surface state compatible with the gluing of another platelet or substrate also called wafer. The encapsulation layer 121 and the remaining part of the top Si 12 comprising the waveguide 120 form an optical layer 122. The optical layer 122 thus has a silicon oxide SiO2-based surface 212c. The waveguide 120 is typically buried under the surface 212c at a depth of around 10 nm to 150 nm.

As illustrated in FIG. 1D, a second substrate 2 is brought facing the optical layer 122. This substrate 2 typically comprises in stack along z, a thin InP-based germination layer 22, an InGaAs-based sacrificial layer 21, and an InP-based bulk part 20.

The thickness $e_{22}$ of the germination layer 22 is typically around 100 nm to 300 nm. The thickness $e_{21}$ of the sacrificial layer 21 is typically around 200 nm to 400 nm. The thickness $e_{20}$ of the bulk part 20 can be around a few microns to a few tens of microns, even a few hundred microns.

This stack of material III-V-based layers is rotated so as to have the germination layer 22 facing the optical layer 122, then glued, for example by direct hydrophilic gluing. For this type of gluing, the surfaces 220c, 212c are made hydrophilic by adapted surface treatments. The surface 220c of the InP-based germination layer 22 is typically cleaned beforehand by a hydrofluoric acid-based solution, then exposed to an oxygen plasma and/or ozone. The SiO2-based surface 212c of the optical layer 122 is typically exposed to an oxygen plasma and/or ozone. After assembly of the surfaces 220c, 212c thus prepared, a thermal annealing of around 300° is carried out so as to finalise this direct hydrophilic gluing.

As illustrated in FIG. 1E, after gluing, the InP-based bulk part 20 is first removed, then the sacrificial layer 21 is selectively removed at the germination layer 22. The removal of the bulk part 20 can be done by mechanical cropping and/or by chemical etching. The removal of the sacrificial layer 21 is done preferably by selective etching of InGaAs visà-vis InP, for example by wet etching on the basis of a sulphuric acid (H2SO4), oxygenated water (H2O2) and water (H2O) mixture, for example in proportions H2SO4:H2O2:H2O of 1:1:20.

The germination layer 22 thus exposed makes it possible to perform a regrowth by epitaxy of a material III-V of excellent crystalline quality.

As illustrated in FIG. 1F, a growth of a structure of laser component III-V can be advantageously performed on this germination layer 22. Preferably, an N-doped InP growth is performed so as to obtain the base layer 221b. AlInGaAs-based quantum wells are then epitaxially grown on this base layer 221b, so as to form the active region 222. The active region 222 can typically comprise a number of quantum wells of between 3 and 20, for example 8. A P-doped InP-based layer 223 is then epitaxially grown. Other layers, for example an InGaAs-based P contact layer, can also be raw on or within this stack, so as to improve the injection of charge carriers, for example.

These material III-V growth steps are typically carried by Vapour Phase Epitaxy from Metalorganic precursors (MOVPE) at growth temperatures greater than or equal to 600° C. The metalorganic precursors which could be used, are for example Trimethylaluminium (TMAl), Trimethylgallium (TMGa), Trimethylindium (TMIn). The sources of V elements can be hydrides (AsH3, PH3). These growths are preferably performed in a localised manner on the first substrate 1, by so-called SAG (Selective Area Growth) techniques.

As illustrated in FIG. 1G, the P-doped layer 223 and the active region 222 are typically etched so as to form a component 23 having a structure at the edge of width $w_{23}$ along x. The width $w_{23}$ is typically of between 500 nm and 3 µm. This component 23 is, for example, a material III-V-based laser. This laser can be of the Fabry-Pérot type, or with distributed Bragg mirrors, or with a ring cavity. The etching is configured such that the component 23 is optically coupled with the waveguide 120. The component 23 can thus be substantially centred visà-vis the waveguide 120 along x. According to an example, the component 23 and the waveguide 120 are in vertical alignment with one another. According to a possibility, the component III-V can be an electrooptical phase modulator.

After etching, a layer 221 coming from the base layer 221b extends typically on either side of the mesa structure 222, 223 of the component 23. This layer 221 is typically intended to form an injection layer for the N-type contact. It has an exposed surface 220. Advantageously, this layer 221 makes it possible to perform an InP:Fe epitaxy on either side of the component 23.

The component 23 can typically comprise the injection layer 221, the active region 222, the layer 223, and optionally a part of the waveguide 120.

As illustrated in FIG. 1H, an InP:Fe-based structure 24 is formed from the layer 221, at the edge of the component 23. The structure 24 is typically formed by MOVPE at a temperature greater than or equal to 600° C. This structure 24 is preferably directly in contact with the sides 224 of the component 23. According to another possibility, a thin layer, also called liner, can be inserted between the structure 24 and the sides 224. This structure 24 advantageously forms a SIBH heat dissipation structure for the component 23. After growth of InP:Fe on the layer 221, a planarisation, for example by chemical-mechanical polishing, is preferably carried out so as to expose the tip 230 of the component 23. A flat surface 230, 225 is thus obtained.

According to an alternative possibility, the component 23 is formed separately, with or without the SIBH heat dissipation structure, and directly transferred onto the optical layer 122. The number of growth steps at a high temperature of materials III-V can thus be limited. After transfer, the waveguide 120 can be in a structured part, for example in the direction y.

As illustrated in FIG. 1I, optionally, an SiO2-based encapsulation layer 25a can be deposited on the flat surface 230, 225 of the level III-V, then planarised. N and P contacts are then formed on the component 23. The P-doped part 223 of the component 23 is thus electrically contacted at a P contact 251, by way of a metal via 251v. The N-doped layer 221 connecting the component 23 is thus electrically contacted at an N contact 252, by way of a metal via 252v. The via 252v passes through the heat dissipation structure 24 and optionally the encapsulation layer 25a.

As illustrated in FIG. 1J, after formation of the vias 251v, 252v and of the P and N contacts 251, 252, a second SiO2-based encapsulation layer 25b is deposited then planarised. A layer 250 comprising a first level of electrical contacts is thus formed.

According to a possibility, the encapsulation layers 25a, 25b can be on the basis of an electrically insulating material which is a good thermal conductor, for example of aluminium nitride AlN.

Optionally, as illustrated in FIG. 1K, a thermal conduction layer 253 can be deposited on the contact layer 250. This thermal conduction layer 253 typically has a high thermal conduction. It can be electrically conductive, for example on the basis of a metal which is compatible with CMOS technology. Such a thermal conduction layer 253, for example gold-based, can also facilitate assembly with another wafer.

As illustrated in FIG. 1L, a third substrate 3, typically silicon-based, is assembled facing the contact layer 250, optionally by way of the thermal conduction layer 253.

At this stage, the structure thus formed comprises in a stack, along z:
- the first substrate 1 comprising the silicon-based optical layer 122,
- a level III-V comprising the component 23 and the heat dissipation structure 24, and possibly one or more through vias,
- a contact layer 250,
- optionally, a thermal conduction layer 253,
- a third silicon-based substrate 3.

As illustrated in FIG. 1M, the substrate 1 is thus partially removed. In particular, the bulk part and the BOX are removed by cropping and chemical etching, so as to expose the remaining part of the top Si of the optical layer 122.

This part of the top Si can be advantageously again structured by lithography/etching so as to form a silicon-based component 123. Advantageously, an implantation of doping species can be performed at the level of an implantation zone I. An activation of the doping species by thermal annealing is thus typically performed.

The prior removal of the BOX in particular makes it possible to perform such an implantation. This also makes it possible to perform a doping by diffusion, according to an alternative possibility. A component 123 having implanted and doped zones is thus advantageously obtained. Such a silicon-based component 123 can be, for example, a PN junction phase modulator, another waveguide. According to another possibility, the BOX is partially removed and thinned so as to enable an implantation of doping species in the implantation zone I through the thinned BOX. The localised doping of the top Si is thus advantageously performed after the InP:Fe epitaxy step requiring a large thermal budget. The high-temperature epitaxy step(s) (SAG, SIBH) therefore does/do not disrupt the doping of the top Si. This makes it possible to better control the doping profiles in the top Si.

As illustrated in FIG. 1N, one or more interconnection levels 4 can be formed on the optical layer 122, by conventional BEOL (Back End of Line) methods. In the example illustrated, the through vias 451v, 452v connect the material III-V-based component 23. Other vias 453v, 454v connect the silicon-based component 123. According to a possibility, the interconnection level(s) can be applied on the optical layer 122 by way of a silicon-based interposer. This interconnection level is typically slightly thermally conductive.

The method thus makes it possible to form an optimised architecture for heat dissipation, comprising in a stack along z:
- the silicon-based bulk substrate 3 making it possible to discharge the heat produced by the component 23,
- an optional thermal conduction layer 253,
- a contact layer 250,
- a level III-V comprising the component 23 and the heat dissipation structure 24,
- the optical layer 122 comprising the waveguide 120 optically coupled to the component 23,
- an interconnection level 4.

The method according to the invention thus makes it possible to vertically integrate photonic silicon structures obtained by standard methods, with components III-V obtained by advanced techniques for epitaxially regrowing materials III-V. Advantageously, the epitaxial growth(s) requiring high temperatures greater than 600° C. are first performed, then the stack is returned so as to perform standard silicon technology steps.

The heat produced by the component III-V is typically discharged via the dissipation structure 24 and the substrate 3, opposite the waveguide 120 and/or the interconnection level. The optical properties of the waveguide 120 are thus not affected by the heat flow. The interconnection level further forms a heat barrier insulating the upper levels, for example a level comprising control electronics. The component 23 and its control electronics can thus be thermally insulated from one another by the interconnection level.

Figure 2:
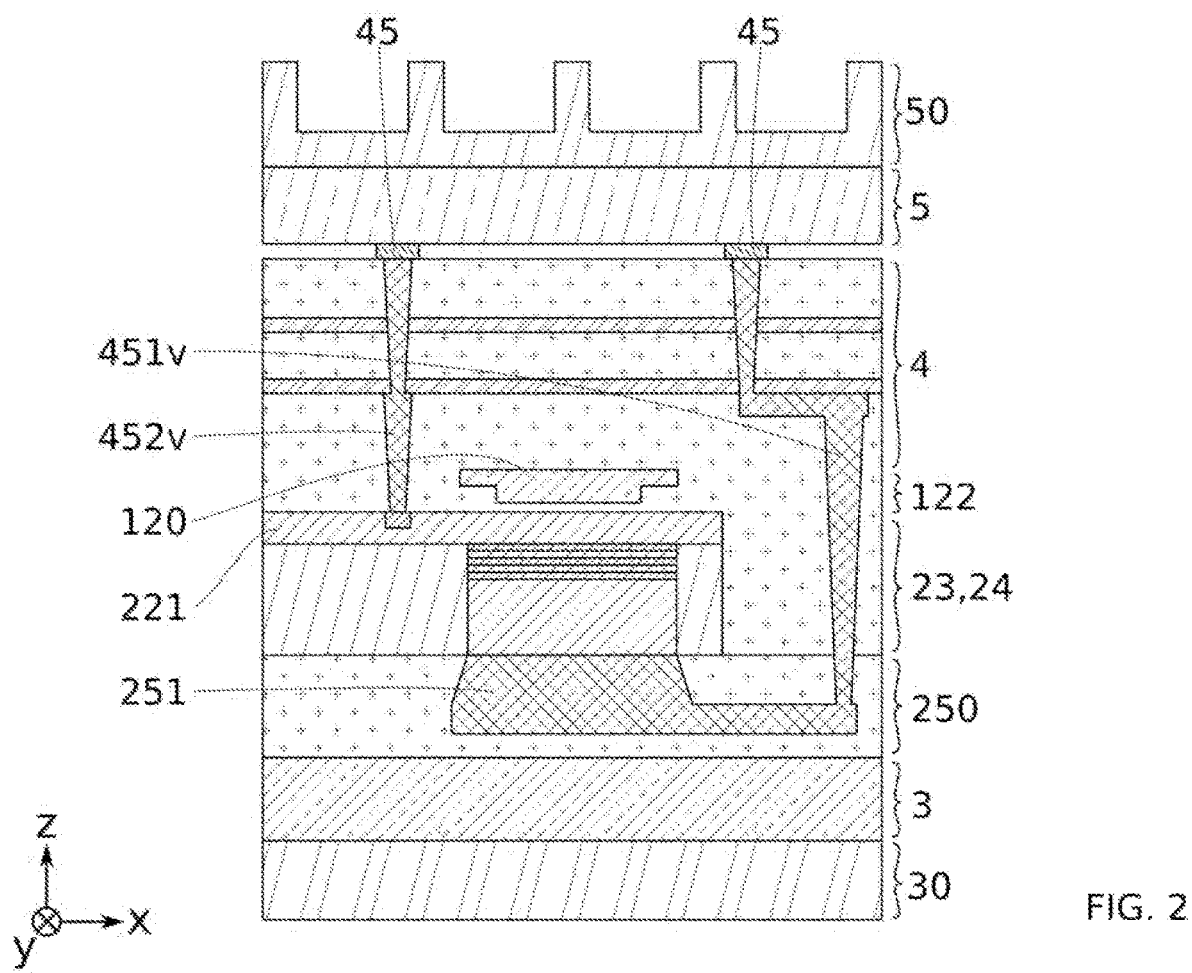
FIG. 2 schematically illustrates, as a transverse cross-section, an integration system according to another embodiment of the present invention.

FIG. 2 illustrates another example of architecture obtained by this method. In this example, the layer 221 extends laterally from the component 23 dissymmetrically with respect to the sides of the component 23. This makes it possible, for example, to facilitate the formation of the via 451v.

Control electronics 5 can be assembled to the interconnection level 4 by contact terminals 45. A radiator 50 can be disposed on the control electronics 5 to discharge the heat produced by this control electronics 5. A device 30, for example, a heat dissipator or a Peltier, can be added on the side of the substrate 3 so as to improve the discharging of the heat produced by the component 23. The encapsulation layer part inserted between the substrate 3 and the P contact 251 is advantageously thin, and typically has a thickness less than or equal to 500 nm, preferably less than 200 nm.

The hetero-integration III-V/silicon architectures proposed in this case enable, in particular:
- A better dissipation of heat from the components III-V, and a thermal insulation visà-vis the control electronics and/or the silicon-based waveguide,
- A compatibility with standard BEOL CMOS technologies,
- A compatibility with (SAG- and/or SIBH-type) advanced regrowth techniques.

The invention is not limited to the embodiments described above.

The invention claimed is:

1. A method for on-silicon integration of a III-V-based material component comprising:
    providing a first substrate comprising a silicon-based optical layer, said optical layer comprising at least one waveguide,
    transferring a second III-V-based material substrate on the optical layer,
    forming the component from the second substrate, in a proximity of the waveguide so as to enable a coupling between the waveguide and the component, by preserving a III-V-based material layer extending laterally from the component,
    forming by epitaxy from the III-V-based material layer an InP:Fe-based structure laterally bordering the component,
    forming a layer comprising contacts configured to electrically contact the component, on a face of the component opposite the optical layer, and
    transferring a third silicon-based substrate on the layer comprising the contacts.

2. The integration method according to claim 1, further comprising, after transfer of the third silicon-based substrate:
    removing the first substrate and preserving the optical layer, and
    forming at least one interconnection level on the optical layer, the at least one interconnection level comprising interconnections electrically connecting the contacts.

3. The integration method according to claim 2, wherein removing the first substrate is performed so as to expose the optical layer, the method further comprising, after removing the first substrate, doping of a silicon-based zone of the optical layer.

4. The integration method according to claim 3, further comprising, before the doping, at least one step carried out at a temperature greater than or equal to 600° C.

5. The integration method according to claim 3, wherein doping the silicon-based zone comprises implantation of doping species.

6. The integration method according to claim 2, wherein the first substrate is a substrate of the on-insulator semi-conductive type comprising a buried oxide layer between a first silicon bulk part and a second semi-conductor-based thin part, and wherein removing the first substrate comprises removing the first bulk part and the buried oxide layer.

7. The integration method according to claim 1, wherein forming the component comprises:
thinning the second III-V-based material substrate so as to preserve a III-V-based material germination layer, and
formation of forming the component by localised epitaxy only on one part of the germination layer.

8. The integration method according to claim 7, wherein the second III-V-based material substrate comprises a sacrificial layer inserted between a bulk part of the second substrate and a part configured to form the germination layer, and wherein the thinning comprises:
at least one from among a mechanical cropping of the bulk part of the second substrate and a selective chemical etching of the bulk part of the second substrate vis-à-vis the sacrificial layer, and
selective etching of the sacrificial layer vis-à-vis the layer configured to form the germination layer.

9. The integration method according to claim 1, wherein forming the component comprises:
thinning the second III-V-based material substrate so as to preserve a III-V-based material germination layer,
forming by epitaxy of a stack of III-V-based material functional layers, on the germination layer, and
etching a part of the stack so as to form the component and the III-V-based material layer extending laterally from the component.

10. The integration method according to claim 1, wherein forming the component comprises forming AlInGaAs or GaInAsP alloy-based quantum wells.

11. The integration method according to claim 1, further comprising, before transferring the third substrate, forming a thermal conduction layer on at least one from among the layer comprising the contacts and the third substrate, so as to insert said thermal conduction layer between the third substrate and the layer comprising the contacts.

12. The integration method according to claim 1, wherein the III-V-based material layer extending laterally from the component is N-doped InP-based.

* * * * *